United States Patent
Jiang

(10) Patent No.: US 7,221,575 B1
(45) Date of Patent: May 22, 2007

(54) PSEUDO TERNARY CONTENT ADDRESSABLE MEMORY DEVICE HAVING ROW REDUNDANCY AND METHOD THEREFOR

(75) Inventor: Bin Jiang, Milpitas, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 11/281,227

(22) Filed: Nov. 17, 2005

Related U.S. Application Data

(60) Provisional application No. 60/629,694, filed on Nov. 19, 2004.

(51) Int. Cl.
G11C 15/00 (2006.01)
G11C 7/00 (2006.01)
(52) U.S. Cl. .................... 365/49; 365/189.07; 365/200
(58) Field of Classification Search ............... 365/49, 365/189.07, 200
See application file for complete search history.

(56) References Cited

U.S. PATENT DOCUMENTS

| | | | |
|---|---|---|---|
| 6,766,317 B2 * | 7/2004 | Sharma et al. | 707/3 |
| 6,781,857 B1 * | 8/2004 | Lien et al. | 365/49 |
| 2003/0165073 A1 * | 9/2003 | Lien et al. | 365/49 |

* cited by examiner

*Primary Examiner*—Son T. Dinh
(74) *Attorney, Agent, or Firm*—Bradley T. Sako

(57) ABSTRACT

A pseudo ternary content addressable memory (PTCAM) device (100) can include a number of PTCAM blocks (102-0 to 102-63), each of which can include a number of standard PTCAM rows (106-0 to 106-63) and a standard memory row (104-0 to 104-63) for storing and providing mask information for the PTCAM rows. Redundancy for replacing a defective standard PTCAM row can be provided by a redundant section (108) that include fewer PTCAM rows than in a PTCAM block (102-0 to 102-63). Non-defective PTCAM rows within a standard PTCAM block containing a defective PTCAM row can continue to operate.

20 Claims, 7 Drawing Sheets

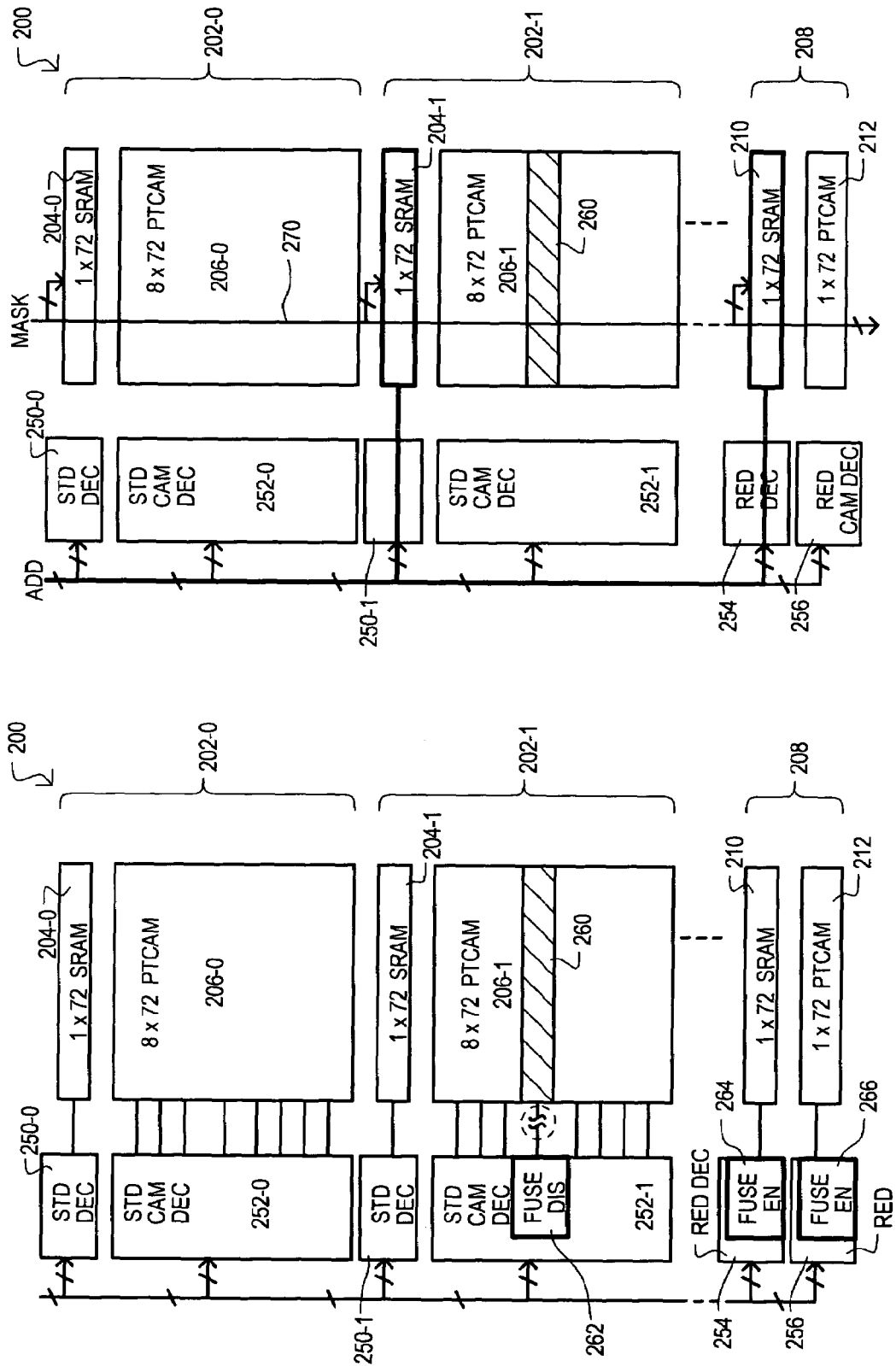

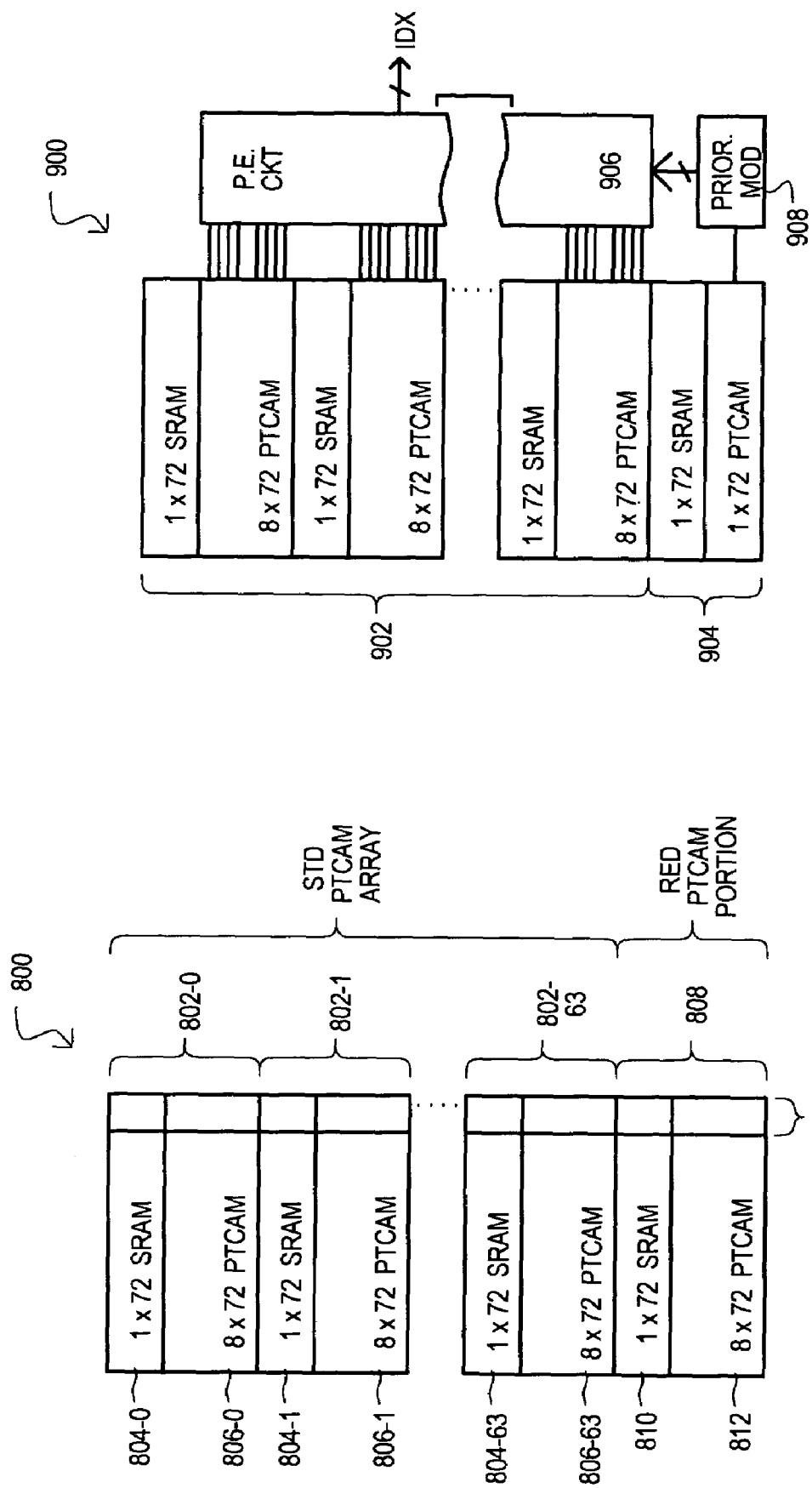

PSEUDO TERNARY CONTENT ADDRESSABLE MEMORY DEVICE HAVING ROW REDUNDANCY AND METHOD THEREFOR

This application claims the benefit of U.S. Provisional Patent Application Ser. No. 60/629,694 filed Nov. 19, 2004, the contents of which are incorporated by reference herein.

TECHNICAL FIELD

The present invention relates generally to content addressable memory (CAM) devices and more particularly to pseudo ternary CAM devices.

BACKGROUND OF THE INVENTION

Redundancy architectures and techniques are widely used to improve the yield of random access memory (RAM) devices, such as static RAMs, as but one example. In a typical RAM redundancy arrangement, a fuse element can be placed in series with each word line of a memory array. When a memory cell is determined to be defective, a fuse for the corresponding row can be "blown" (typically causing an open circuit), to thereby de-couple an address decoder from the row incorporating the defective memory cell.

The address of the row having the defective memory cell can be programmed into a spare (redundant) address decoder coupled to a redundant row. Thus, in a subsequent read or write operation, an access directed to the row containing the defective memory cell can be re-directed to the redundant row.

While such conventional redundancy techniques can benefit RAM devices, such approaches are generally not feasible in content addressable memory (CAM) devices.

Unlike RAM devices, CAM devices can include locations that are addressed in response to the content stored, rather than a physical address of the array. Thus, in many conventional arrangements, in a compare (i.e., search) operation, a CAM device can receive a compare data value (i.e., comparand) that is compared to all data values stored within the entries (e.g., rows) of one or all CAM arrays within the CAM device. According to a comparison result, each CAM entry can assert or de-assert an associated match signal. Match results can be provided on match lines coupled to a priority encoder. A priority encoder can translate a matching entry into a matching address or CAM index for output from a CAM device.

Conventionally, each row of a CAM array can be connected to a word line in order to allow data values to be read from and written to the row, as well as a match line that can reflect a match result for such a row.

CAM devices can come in a variety of forms. A binary CAM device can provide bit-by-bit matching between an applied compare data value and values stored within the CAM entries. While appropriate for some applications, it may not always be desirable to match all bits between a compare data value and a stored data value.

A currently more useful type of CAM device is the ternary CAM (or TCAM) device. A TCAM device can provide selective masking of bit compare operations between a compare data value and the stored data values. Accordingly, each entry can be conceptualized as including a stored data value as well as a mask value that can indicate which bits of the stored data value will take place in a compare operation. For example, in some conventions, a mask bit of "one" can indicate that the corresponding bit of a stored data value is to be compared against the corresponding bit of an applied compare data value. In contrast, a mask bit of "zero" can indicate that the corresponding bit of a stored data value is not to be compared against the corresponding bit of an applied compare data value. Such a masked bit is typically forced to provide a "match" result, thus preventing the masked bit from generating a mismatch indication even if the bit value differs from the compare data bit value.

TCAM devices can take various forms. A "full" TCAM device can provide a mask bit for every stored data bit. That is, in a full TCAM device, each separate memory location can be conceptualized has having its own mask field and data field. Thus, in a full TCAM device, each stored mask controls the masking of match operations for exactly one stored data value. Such an arrangement can provide great flexibility in the type of searches performed, but at the cost of considerable circuit size. As a result, full TCAM devices can be relatively high in cost.

One way to provide masking capabilities, and yet not require as much circuit area as a full TCAM device, is to employ a "pseudo" TCAM (PTCAM) device. In a PTCAM device, mapping between a mask and stored data values can be 1:N, where N>1. That is, one mask field can provide mask data to multiple stored data values. This is in contrast to a full TCAM device that is understood to provide 1:1 mapping between mask and stored data values.

To better understand various aspects of the disclosed embodiments, conventional PTCAM devices and redundancy techniques will now be described.

FIG. 10 shows is a general view illustrating a conventional PTCAM device structure. A conventional PTCAM device can include a number of sections (or blocks), one of which is shown as 1000. As shown, each section 1000 can include a mask entry 1002 and a number of PTCAM entries 1004. In the example shown, there is one mask entry per eight PTCAM entries. As represented by the arrows of FIG. 10, a mask entry 1002 can provide mask data to all eight PTCAM entries 1004.

To try to increase yield in the event of defects in a PTCAM device, redundancy techniques have been employed. FIG. 11 shows one conventional approach to implementing redundancy in a PTCAM device. In the conventional arrangement shown, a PTCAM device 1100 can include a number of standard blocks 1102-0 to 1102-63, each of which includes one mask entry, formed by an array of 1×72 static random access memory (SRAM) cells, and eight PTCAM entries, formed in an array of 8×72 PTCAM cells. Also included is one redundant block 1104 that includes one redundant mask entry, formed by an array of 1×72 static random access memory (SRAM) cells, and eight redundant PTCAM entries, formed in an array of 8×72 PTCAM cells.

In the above conventional arrangement, redundancy is implemented on a block-by-block basis. That is, if one row within a standard block (1102-0 to 1102-63) is defective, the entire block is replaced by redundant block 1104. In such an approach, one row of redundant SRAM cells and eight rows of redundant PTCAM cells are used to replace only one defective row (either SRAM or PTCAM). As a result, if only one PTCAM row is defective, seven out of 512 rows of PTCAM cells are wasted. This can result in a waste (or penalty) within an array of about 1%.

In light of the above, it would be desirable to arrive at some way of providing row redundancy in a more space efficient manner than the above conventional approach.

SUMMARY OF THE INVENTION

The present invention can include a pseudo ternary content addressable memory (PTCAM) device that includes at least m memory cell rows, where m is an integer of at least one, each memory cell row providing mask data that selectively inhibits bit comparison operations within n corresponding PTCAM rows, where n is an integer greater than one. Also included are at least p redundant memory cell rows, where p is an integer of at least one, each redundant memory cell row providing mask data that selectively inhibits bit comparison operations within q corresponding redundant PTCAM rows, where q is less than n. Each redundant PTCAM row can have store circuits that store a multi-bit data value and compare circuits that compare the stored data value to a compare data value.

In this way, redundancy for groups of n PTCAM rows can be provided by a smaller number of q redundant PTCAM rows. This can allow redundancy to be implemented without disabling an entire group of standard (non-redundant) PTCAM rows.

According to one aspect of the embodiments, each m memory cell row can provide mask data to at least eight PTCAM rows.

According to another aspect of the embodiments, each memory cell row and redundant memory cell row can comprise static random access memory (SRAM) cells.

According to another aspect of the embodiments, at least one wordline can be commonly connected to one of the m memory cell rows and one of the p redundant memory cell rows.

Such an arrangement can provide essentially simultaneous access to the memory cell row and redundant memory cell row in read and write operations of mask data. Thus, mask data can be simultaneously written to one memory cell row that provides such mask data to non-redundant PTCAM rows, and written to redundant memory cell row that provides mask data to one or more redundant PTCAM rows.

According to another aspect of the embodiments, the number of redundant memory cell rows (p) can be an integer greater than one, and each such redundant memory cell row can provide mask data that selectively inhibits bit comparison operations within one corresponding redundant PTCAM row.

According to another aspect of the embodiments, the at least m memory cell rows can be arranged into a plurality of PTCAM arrays, each comprising a plurality of memory cell rows and a group of PTCAM rows corresponding to each memory cell row. In addition, the q redundant PTCAM rows can be replacement rows for q PTCAM rows in any of the PTCAM arrays.

The present invention can also include a method of providing redundant PTCAM rows. The method can include disabling a defective PTCAM row within a group of PTCAM rows. Each PTCAM row of the group can receive mask information from a row of memory cells. The row of memory cells and a row of redundant memory cells can be accessed essentially simultaneously to write mask information into both such rows. The row of redundant memory cells can provide mask information to a redundant PTCAM row. Data values can be stored in the redundant PTCAM row to replace the defective PTCAM row while retaining the operation of the other PTCAM rows of the group.

In this way, even if a defect exists in one group of PTCAM rows, the remaining non-defective PTCAM rows of the group can still be operational.

According to one aspect of the embodiments, accessing the row of memory cells and a row of redundant memory cells can include activating at least one wordline common to the row of memory cells and the row of redundant memory cells.

According to another aspect of the embodiments, the row of memory cells and the row of redundant memory cells comprise static random access memory (SRAM) cells.

According to another aspect of the embodiments, the method can include, in a compare operation, providing a mask value from the row of memory cells to the group of PTCAM rows, providing the mask value from the row of redundant memory cells to the redundant PTCAM row, and providing a compare data value to at least the non-defective PTCAM rows of the group of PTCAM rows and to the redundant PTCAM row.

According to another aspect of the embodiments, disabling a defective PTCAM row can includes changing the state of at least one fuse-type device.

According to another aspect of the embodiments, accessing a row of memory cells and a row of redundant memory cells essentially simultaneously includes changing the state of a plurality of fuse-type devices.

The present invention can also include a CAM device having a plurality of regular array sections. Each regular array section can include a plurality of regular PTCAM rows that match stored data values against received compare data values, and at least one standard mask row. A standard mask row can provide mask data to the regular PTCAM rows of the regular array section. Mask data can selectively mask matching within the PTCAM rows. A CAM device can also include at least one redundant array section having at least one redundant PTCAM row and at least one redundant mask PTCAM row. The mask data can selectively mask matching within the at least redundant PTCAM row. The number of redundant PTCAM rows of each redundant array section can be less than the number regular PTCAM rows in each regular array section.

According to one aspect of the embodiments, each regular PTCAM row and redundant PTCAM row can include a plurality of PTCAM cells. Each PTCAM cell can have a store circuit and a compare circuit. A compare circuit can have a first input coupled to receive a stored data value bit from the store circuit, a second input coupled to receive a compared data value, and a third input coupled to receive a mask data value.

According to one aspect of the embodiments, each regular PTCAM row can comprise no less than 36 PTCAM cells. Each redundant PTCAM row can comprise no less than 36 PTCAM cells.

According to another aspect of the embodiments, each regular mask row can comprise a plurality of memory cells commonly coupled to a word line. Each redundant mask row can comprise a plurality of memory cells commonly coupled to a redundant word line.

According to another aspect of the embodiments, each regular array section can comprise at least $2^N$ regular PTCAM rows and one standard mask row, where N is an integer greater than one. Each redundant array section can comprise one redundant PTCAM row and one standard mask row. In particular arrangements, a value N can be three.

According to another aspect of the embodiments, at least one standard mask row can comprise a plurality of static random access memory (SRAM) cells, and a redundant mask row can comprise a plurality of SRAM cells. Further, each SRAM cell can comprise a latch circuit that stores complementary bit values at latch nodes, at least one node being coupled to a bit line.

According to another aspect of the embodiments, the number of regular array sections can be N, with each regular array section comprising X regular PTCAM rows, and one standard mask row. In addition, the number of redundant array sections can be N. Each redundant array section can comprise at least one redundant PTCAM row and one redundant mask row.

BRIEF DESCRIPTION OF THE DRAWINGS

FIG. 2A is a block diagram showing a redundancy remapping operation according to an embodiment. FIG. 2B is a block diagram showing a mask write operation according to an embodiment.

FIG. 8 is a block diagram of a PTCAM array according to a third alternate embodiment of the present invention.

FIG. 9 is a block diagram of a PTCAM device according to a fourth alternate embodiment of the present invention.

DETAILED DESCRIPTION

Various embodiments of the present invention will now be described in detail with reference to a number of drawings. The embodiments show a pseudo ternary content addressable memory (PTCAM) device and method of redundancy. More specifically, the embodiments shown a PTCAM device having one or more arrays with a more area efficient redundancy architecture than conventional approaches, and a method of operation the same that can provide improved reliability over conventional approaches.

Briefly, a PTCAM architecture according to the present invention can involve (1) providing a redundant PTCAM block having one or more memory cell rows and fewer PTCAM rows than a standard (non-redundant) block; (ii) commonly activate one or more wordlines to both a redundant memory cell row and the memory cell row of the PTCAM block having the row being replaced; and (iii) performing read and write operations on both memory cell rows in parallel with the commonly activated word line(s).

An architecture and method according to one embodiment of the present invention will now be described in greater detail with reference to FIG. 1.

Figure 1:
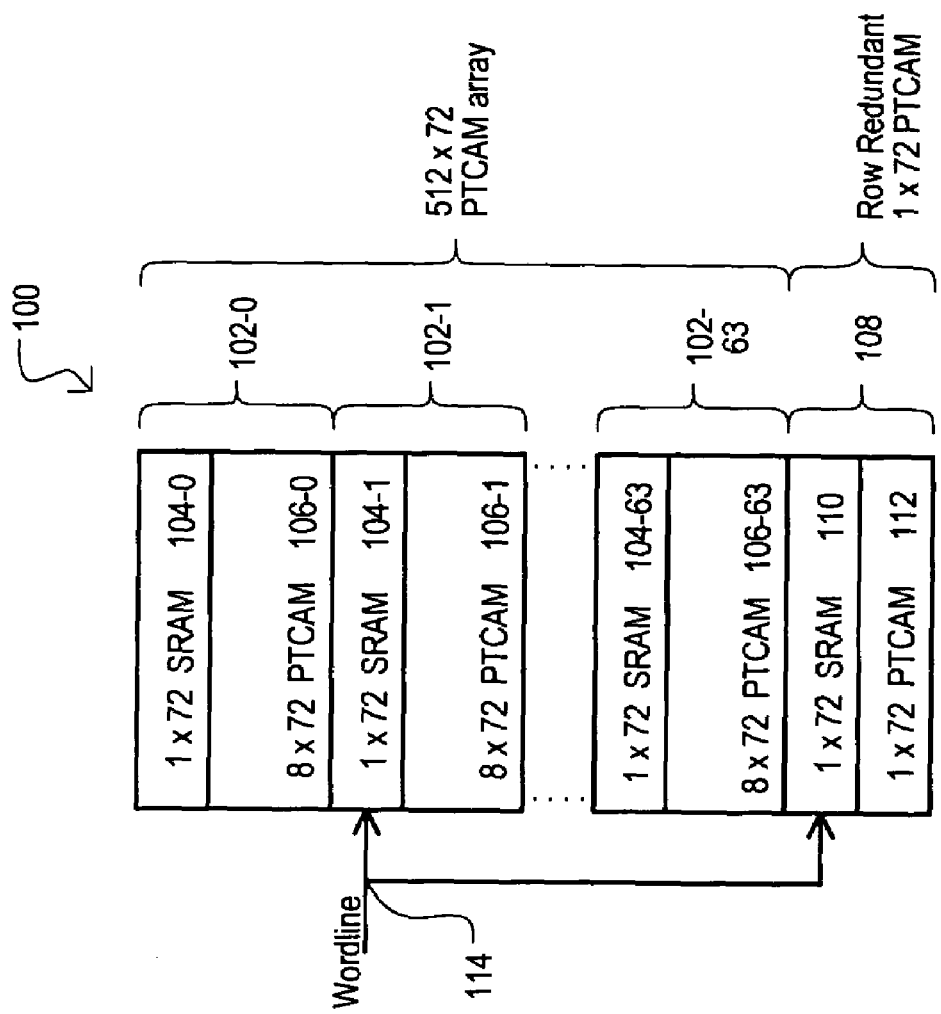
FIG. 1 is a block schematic diagram of a pseudo ternary content addressable memory (PTCAM) array according to a first embodiment of the present invention.

Referring now to FIG. 1, a PTCAM array according to a first embodiment is set forth in a block diagram and designated by the general reference character 100. A PTCAM array can include a number of standard (i.e., non-redundant) blocks 102-0 to 102-63. Each block (102-0 to 102-63) can include one or more standard memory cell rows 104-0 to 104-63, as well as a number of standard PTCAM rows 106-0 to 106-63. In the very particular example shown, each block includes one row of static random access memory (SRAM) cells, even more particularly 1×72 SRAM cells. Further, each block also includes eight PTCAM rows, even more particularly 8 rows of 1×72 PTCAM cells.

Of course, such a particular values should not be construed as limiting. Any number of ratios between memory cell rows and PTCAM rows can be employed, provided there are more PTCAM rows for any given memory cell row in each standard block.

The example of FIG. 1 assumes that a PTCAM row within standard block 102-1 is defective, and is to be replaced.

The PTCAM array 100 of FIG. 1 also includes a redundant portion 108. A redundant portion can include one or more redundant memory cell rows 110, as well as a number of redundant PTCAM rows 112. However, unlike a conventional arrangement, the number of redundant PTCAM rows 112 is less than the number of standard PTCAM rows within each standard block (102-0 to 102-63). In the very particular example shown, a redundant portion can include one row of static random access memory (SRAM) cells, even more particularly 1×72 SRAM cells. Further, the redundant portion also includes one redundant PTCAM rows, even more particular a row of 1×72 PTCAM cells.

Of course, such a particular values should not be construed as limiting. Any number of ratios between a redundant memory cell row and redundant PTCAM rows can be employed, provided there are fewer redundant PTCAM rows for a given redundancy section than standard PTCAM cells in each standard block.

In this way, redundancy can be provided with fewer rows than a full standard block, thus reducing the size penalty over conventional arrangements.

Figures 10, 11:
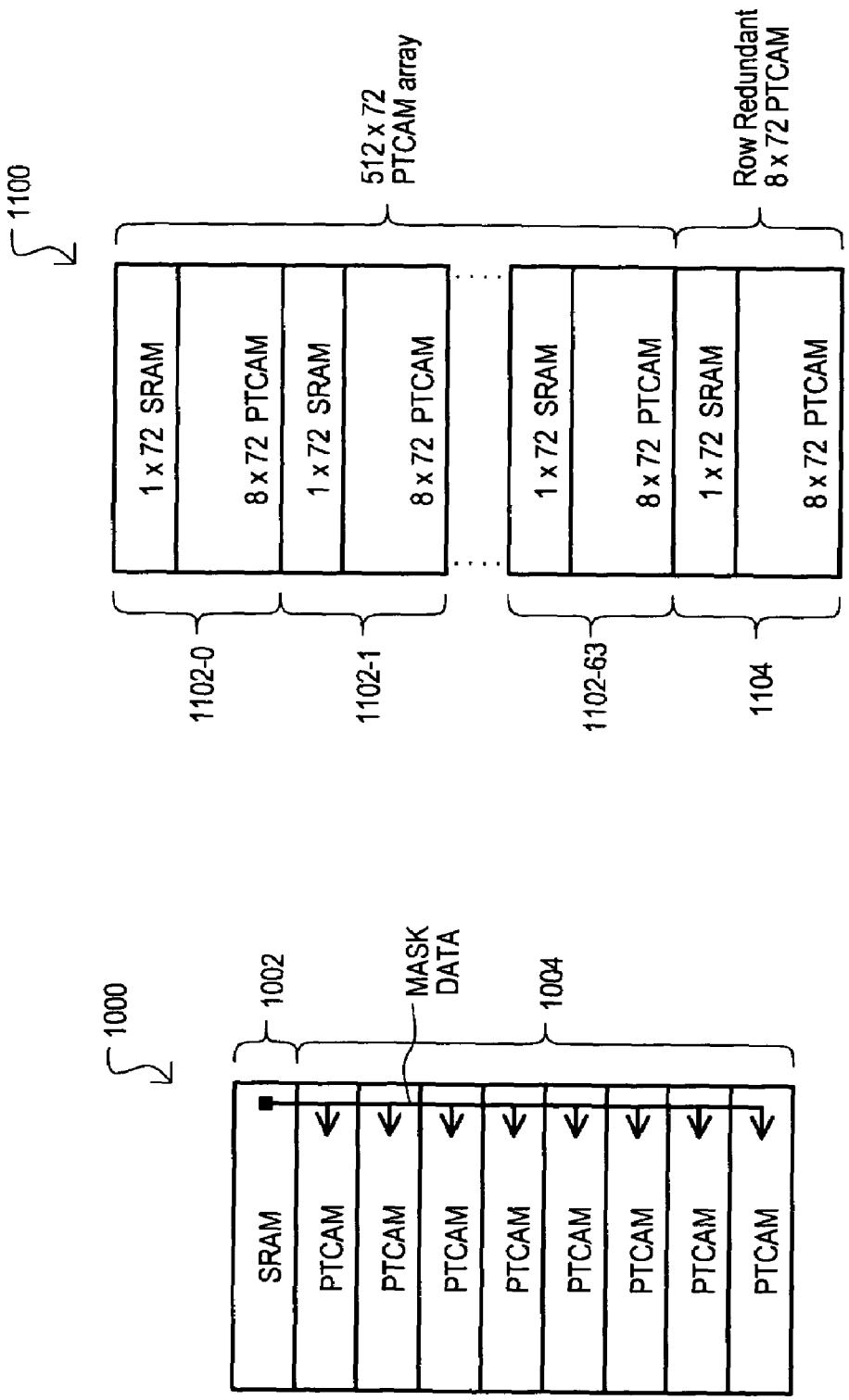
FIG. 10 is a block diagram of a conventional PTCAM array block.
FIG. 11 is a block diagram of a conventional PTCAM array having redundancy capabilities.

It will be recalled that in a conventional approach like that of FIG. 11, when one row is defective within a standard block, the entire standard block is disabled. In contrast, in an arrangement of FIG. 1, only a defective PTCAM row can be disabled, with the remaining PTCAM rows of the same standard block continuing to operate.

Referring still to FIG. 1, in order to ensure that a standard block containing a defect (e.g., 102-1) can continue to operate in tandem with a redundant block 108, one or more wordlines can be commonly activated for memory cell rows of both the redundant block 108 and standard block containing a defect 106-1. Thus, the particular example of FIG. 1 represents such an arrangement with a wordline 114 coupled to both memory cell row 104-1 and redundant memory cell row 110. In such an arrangement, both memory cell rows 104-1 and 110 can be accessed simultaneously to store a same mask value in a write operation, or output a same mask value in a read operation. Further, both rows (104-1 and 110) can provide the same stored mask values to corresponding PTCAM rows (106-1 and 112, respectively) in a compare (i.e., search) operation.

Having described a PTCAM array architecture according to one embodiment, the operation of such a PTCAM array will now be described with reference to FIGS. 2A to 2D. FIGS. 2A to 2D include some of the same general sections as FIG. 1, thus like sections are referred to by the same reference character but with the first digit being a "2" instead of a "1".

FIGS. 2A to 2D also show decoder/wordline driver circuits for each of the memory cell and PTCAM rows. More particularly, FIGS. 2A to 2D show standard memory row decoder/drivers (referred to herein simply as "decoder") 250-0 and 250-1 that can access memory cell rows 204-0 and 204-1, respectively. Similarly, standard PTCAM decoders 252-0 and 252-1 can access PTCAM rows 206-0 and 206-1, respectively. Redundant memory cell row 210 can be accessed by redundant memory row decoder 254 and redundant PTCAM cell row 212 can be accessed by redundant PTCAM decoder 256.

It is understood that standard PTCAM decoder (252-0 and 252-1) can disable access to and/or the operation of any corresponding PTCAM row based on setting one or more fuse-type device, or the like. Optionally, standard memory row decoders (250-0 and 250-1) can also be disabled in a similar fashion. However, it is understood that such memory cell row decoders remain operational in the event a corresponding PTCAM row is defective.

It is noted that a fuse-type device, as described above, is understood to be a circuit structure that can be set by a user and/or manufacturing process from one state to another in order implement redundancy. A fuse-type device can include, without limitation, a fusible link that can be "blown" (made into an electrical open) electrically or via a beam, such as a laser, as but one example. A fuse-type device can also include "anti-fuse" structures, and nonvolatile memory cells, such as electrically erasable and programmable read only memory (EEPROM) cells, as but one example. Finally, a fuse-type device can also include a manufacturing mask option, pin connection option, and/or bonding options. Of course, other approaches for providing equivalent functions would be well known by those skilled in the art.

Redundant PTCAM decoder 256 can enable access to corresponding PTCAM row(s) within, based on setting one or more fuse-type devices, or the like. Similarly, redundant memory row decoder 254 can also be enabled to allow access to memory cell row 210, based on setting one or more fuse-type devices, or the like.

In the examples of FIGS. 2A to 2D, is assumed that standard PTCAM row 260 within PTCAM row group 206-1 is defective, and is to be replaced by redundant PTCAM row 212.

Referring now to FIG. 2A, a remapping operation according to one embodiment is shown. In order to disable defective PTCAM row 260, one (or more) fuse-type elements (262) are set within standard PTCAM decoder 252-1. Such a disabling is represented by an "open" in a CAM wordline leading to PTCAM row 260, but it is understood that such an action may preferably force such a CAM wordline to a disable potential, as but one example.

A remapping operation can also include enabling a redundant portion 208. In one particular approach, within redundant memory row decoder 254, fuse-type elements 264 can be set within redundant memory row decoder 264 to allow access to redundant memory row 210. More particularly, according to conventional techniques, redundant memory row decoder 264 can be programmed to decode a same address as standard memory row decoder 250-1. In this way, both memory rows (204-1 and 210) can be accessed via a shared, or simultaneous wordline access.

In a similar fashion, fuse-type elements 266 can be set within redundant PTCAM row decoder 256 to allow access to redundant PTCAM row 212. More particularly, according to conventional techniques, redundant PTCAM row decoder 256 can be programmed to access redundant PTCAM row 212 in lieu of standard defective PTCAM row 260.

In this way, a PTCAM block (e.g., 202-1) containing a defective row can continue to operate, with the defective PTCAM row being replaced by redundant portion (e.g., 208) having fewer PTCAM rows than the standard PTCAM block.

Referring now to FIG. 2B, a mask write operation according to one embodiment is shown. For purposes of clarity, non-active wordlines have been omitted. The particular operation of FIG. 2B shows the writing of mask data to standard memory row 204-1. However, because a defective PTCAM row has been replaced, the same mask data is also written to redundant memory row 210. Mask data (MASK) can be provided by bit lines 270, or the like.

In this way, a common wordline can access both memory cell rows (204-1 and 210) to enable same mask data (MASK) to be written into both. Preferably, such a write operation is simultaneous to both locations.

Figure 2D:
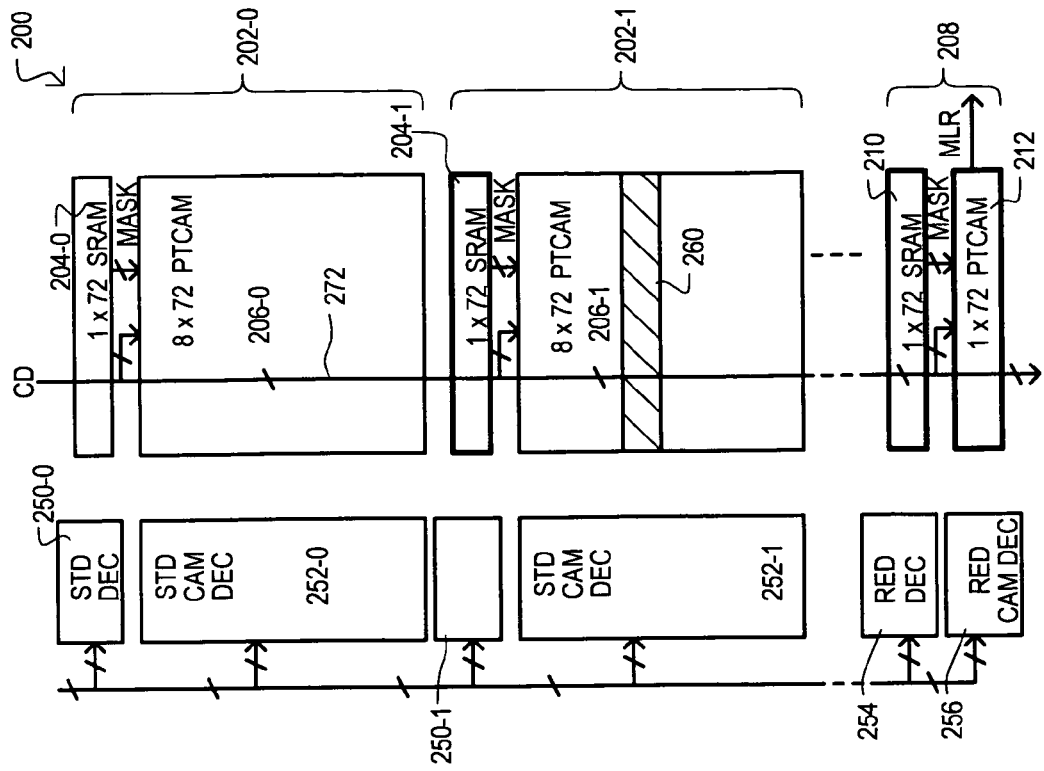
FIG. 2D is a block diagram showing a search operation according to an embodiment.
Figure 2C:
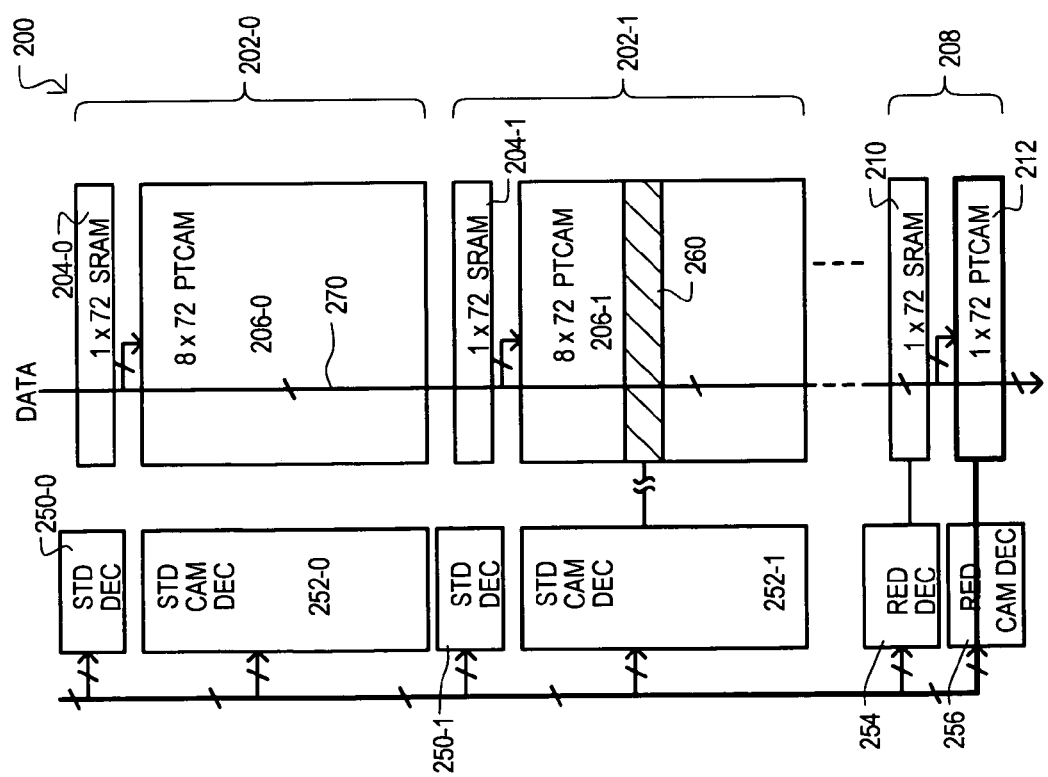
FIG. 2C is a block diagram showing a data write operation according to an embodiment.

Referring now to FIG. 2C, a PTCAM write operation according to one embodiment is shown. Again, for purposes of clarity, non-active wordlines have been omitted. The particular operation of FIG. 2C shows the writing of mask data to the address of defective PTCAM row 260. However, due to the remapping operation illustrated in FIG. 2A, access to defective PTCAM row 260 is prevented, and redundant PTCAM decoder 256 accesses redundant PTCAM row 212 instead. In the very particular example shown, write data (DATA) can be provided to redundant PTCAM row 212 via bit lines 270.

In this way, a single redundant PTCAM row can be utilized to replace one defective PTCAM row in a group of such rows.

Referring now to FIG. 2D, a search (e.g., match) operation according to one embodiment is shown. The particular operation of FIG. 2D shows a search operation in which a data value stored in redundant PTCAM row 212, as masked by redundant memory row 210, matches an applied compare data value (CD). In a search operation, standard memory rows 204-0 and 204-1 can provide mask data to their corresponding PTCAM rows 206-0 and 206-1, respectively. At the same time, redundant memory row 210 can provide mask data to redundant PTCAM row 212. It is understood that the mask data provided by redundant memory row 210 is the same as that provided by standard memory row 204-1.

Compare data (CD) can also be provided to each PTCAM row via compared data lines 272, or the like. Compare data lines can be the same as, or different from, bit lines.

Referring still to FIG. 2D, within each PTCAM row, a compare data value (CD) can be compared to a stored data value as masked by a supplied mask value. In the event a match exists, a PTCAM row can activate a corresponding match line. Accordingly, in the example shown, a match line (MLR) from redundant PTCAM row 212 can be activated. It is understood that a match line (MLR) from redundant PTCAM row can be given the same priority in a priority encoder as the defective PTCAM row 260 it replaces.

In this way, a PTCAM device can have redundancy that does not require the repetition of an entire PTCAM block.

Various particular examples of a memory cell row and PTCAM rows will now be described with reference to FIGS. 3 to 5.

Figure 3:
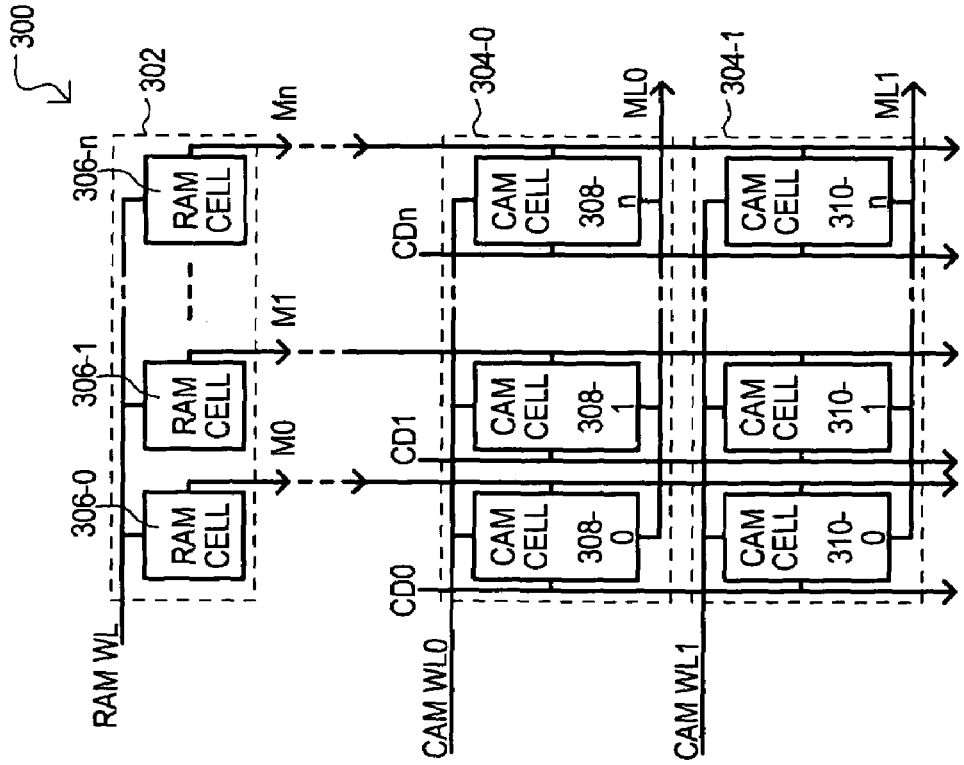
FIG. 3 is a block schematic diagram of a PTCAM array block that can be used in embodiments of the present invention.

FIG. 3 is a block schematic diagram illustrating an example of a portion of a PTCAM device 300. FIG. 3 shows a memory cell row 302 and two corresponding PTCAM rows 304-0 and 304-1. A memory cell row 302 can include a number of memory cells, preferably random access memory (RAM) cells (306-0 to 306-n) accessed via a wordline (RAM WL). Each RAM cell (306-0 to 306-n) can provide a mask data value M0 to Mn to corresponding locations within each PTCAM row (304-0 and 304-1). Preferably, each mask data value (M0 to Mn) can be a single bit value.

Each PTCAM row (304-0 and 304-1) can include a number of PTCAM cells (308-0 to n and 310-0 to n), each accessed by a corresponding CAM word line (CAM WL0 and CAM WL1). Each PTCAM cell (308-0 to n and 310-0 to n) can be coupled to receive mask data from a corresponding RAM cell (306-0 to 306-n) and compare data (CD0 to CDn) values, and provide a compare result to a match line ML0 or ML1.

It is understood that mask values M0 to Mn and/or compare data values C0 to Cn can be provided as single bit values on single lines, or complementary values on two signal lines.

Further, it is also understood that a redundant portion can have the same structure as that of FIG. 3, but include fewer PTCAM rows than a standard section, and preferably only one PTCAM row.

Figure 4:
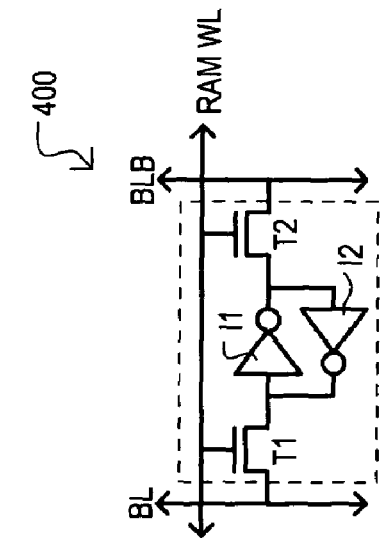
FIG. 4 is a schematic diagram of a memory cell that can be used in embodiments of the present invention.

FIG. 4 is a schematic diagram of one example of a RAM cell 400 that can be included in embodiments of the present invention. A RAM cell can be a static RAM cell having a latch formed by cross-coupled inverters (I1/I2) and pass-gates formed by transistors T1 and T2. Of course, FIG. 4 represents but one particular type of memory cell that can be included in a memory row for storing a mask data value. Alternate types of storage circuits would be readily understood by those skilled in the art. As but a few examples, other mask storage circuits can include dynamic RAM cells, or even nonvolatile memory cells, including but not limited to electrically erasable and programmable read only memory (EEPROM) cells, as but one example.

Figure 5:
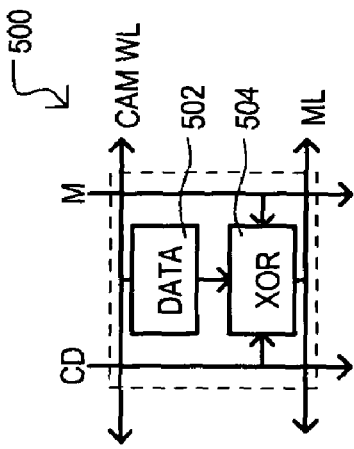
FIG. 5 is a blocks schematic diagram of a PTCAM cell that can be used in embodiments of the present invention.

FIG. 5 is a block schematic diagram of one example of a PTCAM cell that can be included in embodiments of the present invention. A PTCAM cell 500 can include a data storage circuit 502 and a compare logic circuit 504. A storage circuit 502 can provide a data value to compare logic circuit 504. A compare logic circuit 504 can provide a compare result between a data value in storage circuit 502 and a received compare data value CD, as masked (or not masked) by mask value M. In response to such a comparison, a compare logic circuit 504 can alter the state on match line ML. In one particular example, a compare logic circuit 504 can form part of a wire-OR or wire-NOR circuit that includes match line ML.

Referring back to FIG. 1, it is noted that in one embodiment, the number of redundant PTCAM rows 112 can be one. However, in alternate embodiments, a redundant portion of a PTCAM array can include two redundant PTCAM rows, each with a redundant memory cell row associated therewith. This can further increase redundancy capabilities of a PTCAM by allowing for the replacement of two standard PTCAM rows. One example of such an arrangement is shown in FIG. 6.

Figures 6, 7:
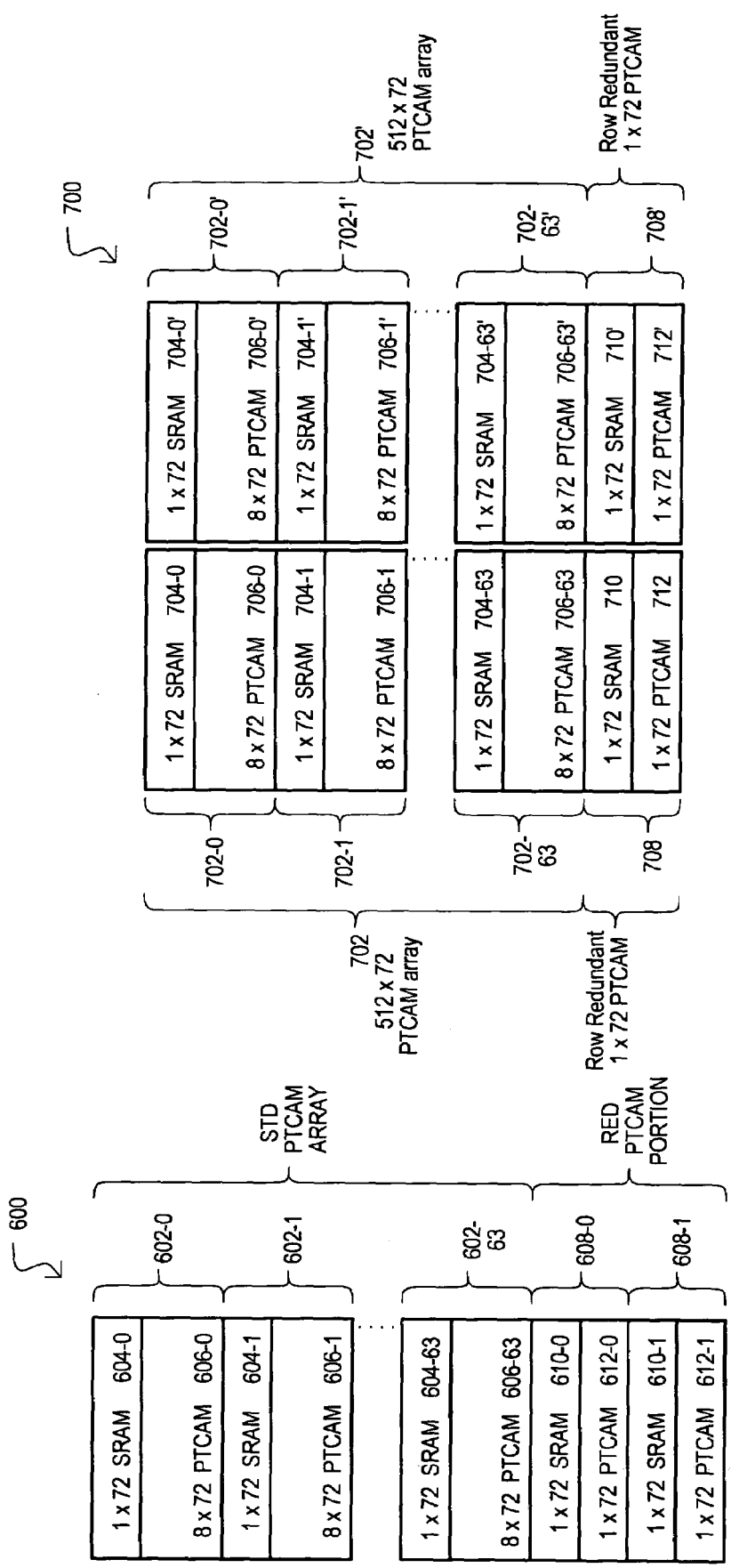
FIG. 6 is a block diagram of a PTCAM array according to a first alternate embodiment of the present invention.
FIG. 7 is a block diagram of a PTCAM device according to a second alternate embodiment of the present invention.

FIG. 6 is a block diagram of a PTCAM array 600 having a number (64, in this example) of PTCAM blocks (602-0 to 602-63). Redundancy for such blocks can be provided by two redundant portions 608-0 and 608-1, each of which includes a redundant memory row 610-0/1 and one redundant PTCAM row 612-0/1.

Another alternate embodiment is set forth in FIG. 7, and designated by the general reference character 700. FIG. 7 shows a PTCAM device 700 having at least two PTCAM arrays 702 and 702', each of which has a corresponding redundant portion 708 and 708'. Redundant portion 708 can provide redundancy capabilities for standard PTCAM rows present in PTCAM array 702, and redundant portion 708' can provide redundancy capabilities for standard PTCAM rows present in PTCAM array 702-1.

An arrangement like that of FIG. 7 can further reduce a size of a die on which a PTCAM is formed, by needing less area for redundancy capabilities, as compared to conventional approaches that provide block-by-block replacement for multiple arrays.

One advantage of an architecture and method of the above embodiments over conventional approaches can be reduction in the size of redundant rows, and therefore a reduction in PTCAM die size. This, in turn, can result in lower production costs, enable larger array sizes, or both.

It will be understood that the above redundancy techniques of the disclosed embodiments may not address defects present in memory cell rows that store mask data. However, yield analysis has demonstrated that memory row (e.g., SRAM cell) failures have little or negligible impact on PTCAM device yields, as such circuit sections typically occupy from about 7% to 9% of total array area.

However, for even greater coverage, an alternate embodiment can include column redundancy to address defects in a memory cell row. One example of such an approach is shown in FIG. 8, and designated by the general reference character 800.

A PTCAM array 800 can include, in addition to a redundant section 808, redundant columns 850. Redundant columns 850 can provide redundant memory cells in each memory cell row and PTCAM row. According to well understood conventional column redundancy techniques, a column containing a defective memory cell can be disabled, and redirected to one of the redundant columns. Compare data values are likewise re-directed in a search operation.

A PTCAM device according to a fourth embodiment is shown in FIG. 9, and designated by the general reference character 900. A PTCAM device 902 can include a standard PTCAM array 902, a redundant PTCAM portion 904, a priority encoder (P.E.) circuit 906, and a priority modification circuit 908. A standard PTCAM array 902 can include can include any of the standard PTCAM array or block structures described in the above embodiments. Similarly, a redundant portion 904 can include any of the redundant PTCAM portions described in the above embodiments.

A P.E. circuit 906 can prioritize match indications generated by standard PTCAM array 902, to generate an index value IDX representative of a match indication that is determined to have a highest priority. As but one example, priority can be based on a lowest physical address from among matching entries. However, a P.E. circuit 906 prioritization operation can be modified according to priority modification circuit 906. Priority modification circuit 906 can receive redundant match line(s) from redundant portion 904. When a redundant match lines is active, priority modification circuit 906 can modify prioritization within P.E. circuit 906 in order to ensure the redundant match line is given the same priority as the corresponding defective PTCAM row that is replaced.

It is also understood that the embodiments of the invention may be practiced in the absence of an element and or step not specifically disclosed. That is, an inventive feature of the invention can be elimination of an element.

The foregoing description of specific embodiments and examples of the invention have been presented for the purpose of illustration and description, and although the invention has been described and illustrated by certain of the preceding examples, it is not to be construed as being limited thereby. The embodiments are not intended to be exhaustive or to limit the invention to the precise forms disclosed, and many modifications, improvements and variations within the scope of the invention are possible in light of the above teaching. It is intended that the scope of the invention encompass the generic area as herein described, and by the claims appended hereto and their equivalents.

What is claimed is:

1. A pseudo ternary content addressable memory (PTCAM) device, comprising:
at least m memory cell rows, where m is an integer of at least one, each memory cell row providing mask data that selectively inhibits bit comparison operations within n corresponding PTCAM rows, where n is an integer greater than one; and
at least p redundant memory cell rows, where p is an integer of at least one, each redundant memory cell row providing mask data that selectively inhibits bit comparison operations within q corresponding redundant PTCAM rows, where q is less than n, each redundant PTCAM row having store circuits that store a multi-bit data value and compare circuits that compare the stored data value to a compare data value.

2. The PTCAM device of claim 1, wherein:
each m memory cell row provides mask data to at least eight PTCAM rows.

3. The PTCAM device of claim 1, wherein:
each memory cell row and redundant memory cell row comprises static random access memory (SRAM) cells.

4. The PTCAM device of claim 1, further including:
at least one wordline commonly connected to one of the at least m memory cell rows and one of the at least p redundant memory cell rows that provides essentially simultaneous access to said at least one memory cell row and at least one redundant memory cell row in read and write operations to said memory cell rows.

5. The PTCAM device of claim 1, wherein:
p is an integer greater than one, and each redundant memory cell row provides mask data that selectively inhibits bit comparison operations within one corresponding redundant PTCAM row.

6. The PTCAM device of claim 1, wherein:
the at least m memory cell rows are arranged into a plurality of PTCAM arrays, each comprising a plurality of memory cell rows and a group of PTCAM rows corresponding to each memory cell row; and
the q redundant PTCAM rows are replacement rows for PTCAM rows in any of the PTCAM arrays.

7. A method of providing redundant pseudo ternary content addressable memory cell (PTCAM) rows, comprising the steps of:
disabling a defective PTCAM row within a group of PTCAM rows, each PTCAM row of the group receiving mask information from a row of memory cells;
accessing the row of memory cells and a row of redundant memory cells essentially simultaneously to write mask into both such rows, the row of redundant memory cells providing the mask information to at least one redundant PTCAM row; and
storing data values in the redundant PTCAM row to replace the defective PTCAM row while retaining the operation of the other PTCAM rows of the group.

8. The method of claim 7, wherein:
accessing the row of memory cells and the row of redundant memory cells includes commonly activating at least one wordline in the row of memory cells and the row of redundant memory cells.

9. The method of claim 7, wherein:
the row of memory cells and a row of redundant memory cells comprise static random access memory (SRAM) cells.

10. The method of claim 7, further including:
in a compare operation,
providing a mask value from the row of memory cells to the group of PTCAM rows,
providing the mask value from the row of redundant memory cells to the redundant PTCAM row, and
providing a compare data value to at least the non-defective PTCAM rows of the group of PTCAM rows and to the redundant PTCAM row.

11. The method of claim 7, wherein:
disabling the defective PTCAM row includes changing the state of at least one fuse-type device.

12. The method of claim 7, wherein:
accessing the row of memory cells and a row of redundant memory cells essentially simultaneously includes changing the state of a plurality of fuse-type devices.

13. A content addressable memory (CAM) device, comprising:
a plurality of regular array sections, each regular array section comprising a plurality of regular PTCAM rows that match stored data values against received compare data values, and at least one standard mask row that provides mask data to the regular PTCAM rows of the regular array section, the mask data selectively masking matching within the PTCAM rows; and
at least one redundant array section comprising at least one redundant PTCAM row and at least one redundant mask row that provides the mask data to the at least one redundant PTCAM row, the mask data selectively masking matching within the at least one redundant PTCAM row; wherein
the number redundant PTCAM rows of each redundant array section is less than the number regular PTCAM rows in each regular array section.

14. The CAM device of claim 13, wherein:
each regular PTCAM row and redundant PTCAM row comprises a plurality of PTCAM cells, each PTCAM cell having a store circuit and a compare circuit, the compare circuit having a first input coupled to receive a stored data value bit from the store circuit, a second input coupled to receive a compare data value, and a third input coupled to receive a mask data value.

15. The CAM device of claim 14, wherein:
each regular PTCAM row comprises no less than 36 PTCAM cells; and
the at least one redundant PTCAM row comprises no less than 36 PTCAM cells.

16. The CAM device of claim 13, wherein:
each regular mask row comprises a plurality of memory cells commonly coupled to a word line; and
the at least one redundant mask row comprises a plurality of memory cells commonly coupled to the word line.

17. The CAM device of claim 16, wherein:
each regular array section comprises at least $2^N$ regular PTCAM rows, where N is an integer greater than one and one standard mask row; and
each redundant array section comprises one redundant PTCAM row and one standard mask row.

18. The CAM device of claim 17, wherein:
the integer N is three.

19. The CAM of claim 13, wherein:
the at least one standard mask row comprises a plurality of static random access memory (SRAM) cells; and
the at least one redundant mask row comprises a plurality of SRAM cells; wherein
each SRAM cell comprises a latch circuit that stores complementary bit values at latch nodes, at least one node being coupled to a bit line.

20. The CAM of claim 13, wherein:
the number of regular array sections is N, each regular array section comprises X regular PTCAM rows, and one standard mask row; and
the at least one redundant array section includes N redundant array sections, each comprising at least one redundant PTCAM row and one redundant mask row.

* * * * *